United States Patent
Hegedus et al.

(10) Patent No.: US 10,048,328 B2
(45) Date of Patent: Aug. 14, 2018

(54) REDUNDANT MAGNETIC ANGLE SENSOR WITH IMPROVED ACCURACY

(71) Applicant: Infineon Technologies AG, Neubiberg (DE)

(72) Inventors: Ákos Hegedus, Villach (AT); Jürgen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 168 days.

(21) Appl. No.: 14/933,273

(22) Filed: Nov. 5, 2015

(65) Prior Publication Data

US 2017/0131367 A1    May 11, 2017

(51) Int. Cl.
*G01R 33/02*    (2006.01)
*G01R 33/022*    (2006.01)
*G01R 15/20*    (2006.01)
*G01D 5/14*    (2006.01)

(52) U.S. Cl.
CPC ........... *G01R 33/022* (2013.01); *G01R 15/20* (2013.01); *G01D 5/14* (2013.01)

(58) Field of Classification Search
CPC .......... G01D 5/14; G01D 5/145; G01D 5/142; H02K 29/08; G01R 33/022; G01R 33/0094; G01R 33/06
See application file for complete search history.

(56) References Cited

U.S. PATENT DOCUMENTS

| | | | | |
|---|---|---|---|---|
| 6,211,588 B1 * | 4/2001 | Balsiger | ................. | G01D 5/145 310/68 B |
| 6,927,566 B2 * | 8/2005 | Apel | ..................... | G01D 5/145 324/174 |
| 7,064,537 B2 * | 6/2006 | Sudo | ..................... | G01D 5/145 324/207.21 |
| 8,857,464 B2 * | 10/2014 | Dolenti | ................. | F02D 11/106 137/554 |
| 2012/0176070 A1 * | 7/2012 | Wallrafen | ............ | G01D 3/0365 318/400.04 |
| 2012/0306487 A1 * | 12/2012 | Yao | ..................... | G01R 15/205 324/252 |
| 2013/0335073 A1 * | 12/2013 | Deak | ..................... | B82Y 25/00 324/207.21 |

* cited by examiner

*Primary Examiner* — Son Le
*Assistant Examiner* — Dustin Dickinson
(74) *Attorney, Agent, or Firm* — Harrity & Harrity, LLP (57) ABSTRACT

An angle sensor may comprise a first primary sensing element and a second primary sensing element. The first primary sensing element may be positioned adjacent to the second primary sensing element in a plane substantially parallel with respect to a face of a magnet. The angle sensor may comprise a first auxiliary sensing element and a second auxiliary sensing element. The first primary sensing element and the second primary sensing element may be positioned between the first auxiliary sensing element and the second auxiliary sensing element in the plane substantially parallel with respect to the face of the magnet.

20 Claims, 9 Drawing Sheets

REDUNDANT MAGNETIC ANGLE SENSOR WITH IMPROVED ACCURACY

BACKGROUND

A magnetic angle sensor may be used to determine an orientation of a magnetic field (e.g., an angle between zero degrees and three hundred and sixty degrees) produced by a magnet. The magnetic angle sensor may be a Hall-effect sensor, a magnetoresistive (MR) sensor, a variable reluctance sensor (VRS), a fluxgate sensor, or the like.

SUMMARY

According to some possible implementations, an angle sensor may include: a first primary sensing element and a second primary sensing element, where the first primary sensing element may be positioned adjacent to the second primary sensing element in a plane substantially parallel with respect to a face of a magnet; and a first auxiliary sensing element and a second auxiliary sensing element, where the first primary sensing element and the second primary sensing element may be positioned between the first auxiliary sensing element and the second auxiliary sensing element in the plane substantially parallel with respect to the face of the magnet.

According to some possible implementations, a magnetic sensor may include: a first primary sensing element and a second primary sensing element, where the first primary sensing element may be positioned adjacent to the second primary sensing element in a plane substantially parallel to a face of a magnet, where the first primary sensing element and the second primary sensing element may be substantially equal in distance from an axis of rotation of the magnet; and a first auxiliary sensing element and a second auxiliary sensing element, where the first primary sensing element and the second primary sensing element may be positioned between the first auxiliary sensing element and the second auxiliary sensing element in the plane substantially parallel to the face of the magnet, where the first auxiliary sensing element and the second auxiliary sensing element may be substantially equal in distance from the axis of rotation of the magnet.

According to some possible implementations, a magnetic angle sensor, may include: a first primary sensing element; a second primary sensing element; a first auxiliary sensing element; and a second auxiliary sensing element, where the first primary sensing element may be positioned adjacent to the second primary sensing element, where the first auxiliary sensing element may be positioned adjacent to the first primary sensing element, where the second auxiliary sensing element may be positioned adjacent to the second primary sensing element, and where the first primary sensing element and the second primary sensing element may be positioned between the first auxiliary sensing element and the second auxiliary sensing element.

DETAILED DESCRIPTION

The following detailed description of example implementations refers to the accompanying drawings. The same reference numbers in different drawings may identify the same or similar elements.

Functional safety represents a differentiator for current and future products associated with, for example, the automotive industry. As such, concepts may have to be developed to reach a functional safety goal, such as an automotive safety integrity level (ASIL). In order to reach a particular ASIL level, different parameters (e.g., failure-in-time (FIT) rate, diagnostic coverage, single point faults metrics (SPFM), latent fault metrics (LPFM) etc.) may need to reach target values (e.g., based on the desired ASIL level).

For a magnetic angle sensor (herein referred to as an angle sensor), a functional safety goal may be to ensure a particular level of angle accuracy within a threshold amount of time. For example, the functional safety goal may be to ensure that a deviation of five or more degrees from an actual angle of a magnetic field (e.g., as compared to an angle of the magnetic field sensed by the angle sensor) is detected in five milliseconds (ms) or less. However, in order to achieve this safety goal, the angle sensor may need to be configured to provide redundancy for the angle as sensed by the angle sensor.

In a typical case, a pair of spatially separated angle sensors may be used to provide redundancy. For example, signals (e.g., a sine signal and a cosine signal) associated with the magnetic field sensed by a primary angle sensor may be compared to signals associated with the magnetic field sensed by an auxiliary angle sensor. Here, the signals associated with the primary angle sensor may be validated when, for example, a difference between the primary signals and the auxiliary signals results in a calculated angle that satisfies a threshold (e.g., less than or equal to three degrees, is less than five degrees, etc.). In such a case, both the primary angle sensor and the auxiliary angle sensor should exhibit identical or near-identical angle error over the measurement range.

However, due to the spatial separation, primary sensing elements of the primary angle sensor may be exposed to different magnetic field conditions than auxiliary sensing elements of the auxiliary angle sensor. As such, the magnetic field angle to which the primary angle sensor is exposed to may be different from the magnetic field angle to which the auxiliary angle sensor is exposed. For example, in some cases, the primary sensing elements may be positioned at an ideal position with respect to the magnetic field, such as a position that allows the primary sensing elements to be substantially (e.g., within one millimeter, within ten micrometers, etc.) centered on an axis of rotation of the magnet, while the auxiliary sensing elements may be positioned at a non-ideal position, such as a position that causes each of the auxiliary sensing elements to be at different distances from the axis of rotation of the magnet (i.e., not substantially centered on the axis of rotation). In such a case, due to the different magnetic field conditions, the auxiliary angle sensor may exhibit inferior angle accuracy as compared to angle accuracy of the primary angle sensor.

As a result, there may exist a difference in performance between the primary angle sensor and the auxiliary angle sensor, thereby reducing reliability of signal validation associated with the pair of angle sensors. Moreover, the reliability of the signal validation may be even worse in a case where there exists a misalignment between the primary sensing elements and the axis of rotation (e.g., an excentricity). Furthermore, when the spatial separation of the primary angle sensor and the auxiliary angle sensor is achieved by using a pair of separate substrates, each substrate including an angle sensor structure and optionally an integrated circuit, an electrical connection between the pair of separate substrates may be realized by wire bonds, which may be disadvantageous from a cost and/or a reliability perspective.

Implementations described herein may provide an angle sensor that integrates (e.g., on a single substrate) a primary angle sensor and an auxiliary angle sensor. The integrated angle sensor may include a set of primary sensing elements (e.g., a first pair of full Wheatstone bridges) associated with determining a primary angle measurement of a magnetic field produced by a magnet, and a set of auxiliary sensing elements (e.g., a second pair of full Wheatstone bridges) associated with determining an auxiliary angle measurement of the magnetic field produced by the magnet. In some implementations, the angle sensor may include a discrete angle sensor (e.g., including Wheatstone bridges, as described above). Additionally, or alternatively, the angle sensor may include a (monolithically integrated) integrated circuit (e.g., for signal capturing and conditioning).

Within the integrated angle sensor, the set of auxiliary sensing elements may be spatially separated such that the set of primary sensing elements is positioned between the set of auxiliary sensing elements. Such an arrangement may allow for improved angle accuracy, associated with an angle as sensed by the set of auxiliary sensing elements, and/or may allow for a reduced effect on angle accuracy for the auxiliary sensor when the set of primary sensing elements are excentrically positioned with respect to an axis of rotation of the magnet. As such, redundancy of the integrated angle sensor may be improved (e.g., as compared to spatially separating the primary angle sensor and the auxiliary angle sensor) such that a functional safety goal may be achieved.

Figure 1A:
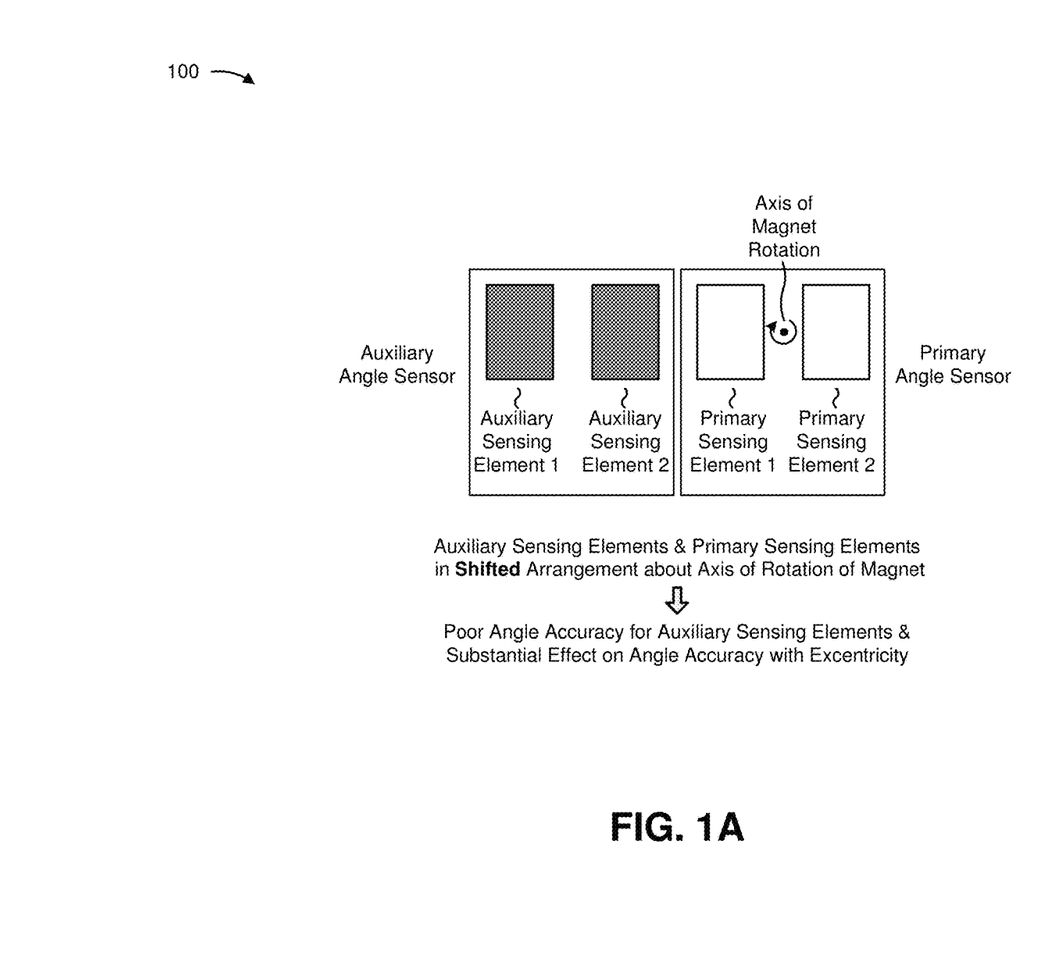
FIGS. 1A and 1B are diagrams of an overview of an example implementation described herein.
Figure 1B:
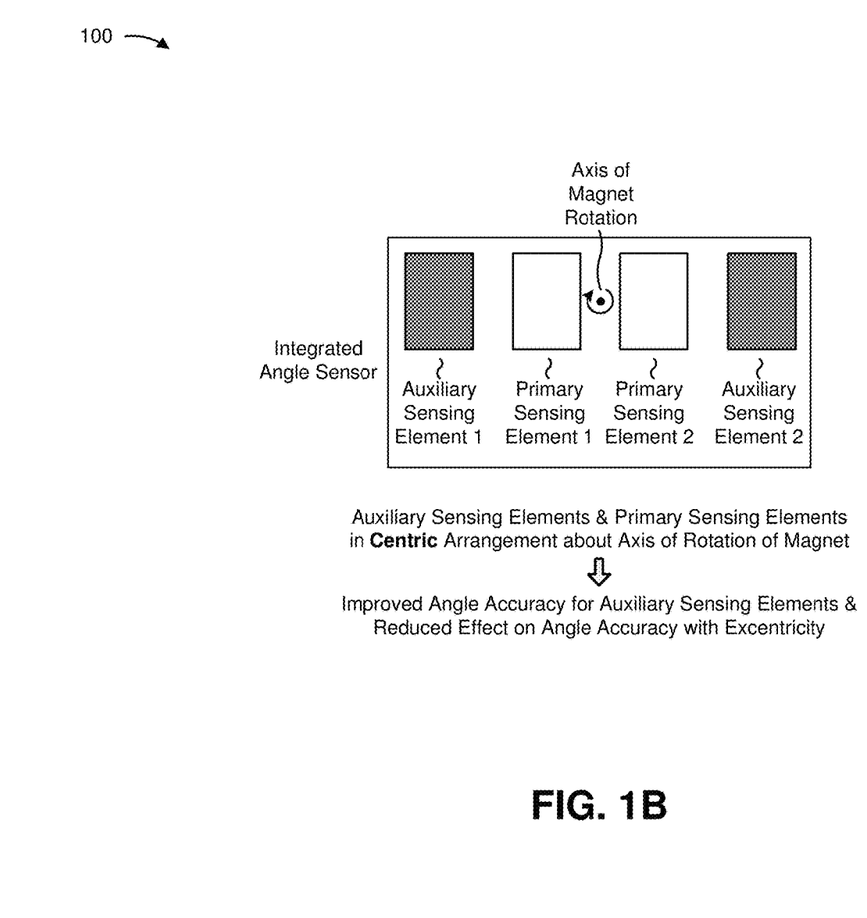

FIGS. 1A and 1B are diagrams of an overview of an example implementation 100 described herein. FIG. 1A shows an example arrangement of a primary angle sensor and an auxiliary angle sensor associated with achieving redundancy for an angle measurement for a magnetic field produced by a magnet that rotates about an axis.

As shown in the FIG. 1A, the primary angle sensor may be spatially separated from the auxiliary angle sensor (e.g., the primary angle sensor and the auxiliary angle sensor may be on two different substrates, the primary angle sensor and the auxiliary angle sensor may be spatially separated on a same substrate, etc.). As shown, the primary angle sensor may include a set of primary sensing elements (e.g., primary sensing element 1 and primary sensing element 2). As further shown, the set of primary sensing elements may be positioned such that the set of primary sensing elements is substantially centered on the axis of rotation of the magnet.

As further shown, the auxiliary angle sensor may include a set of auxiliary sensing elements (e.g., auxiliary sensing element 1 and auxiliary sensing element 2). As shown, the set of auxiliary sensing elements may be positioned such that each of the auxiliary sensing elements is at a different distance away from the axis of rotation of the magnet. In other words, the auxiliary sensing elements may not be substantially centered on the axis of rotation. In some implementations, such an arrangement of the primary sensing elements and the auxiliary sensing elements may be described as a shifted arrangement. In such a case, the set of auxiliary sensing elements may be exposed to different magnetic field conditions from magnetic field conditions to which the set of primary sensing elements is exposed.

As a result, and as noted in FIG. 1A, accuracy of an angle measurement calculated based on signals provided by the set of auxiliary sensing elements may be worse than accuracy of an angle measurement calculated based on signals provided by the set of primary sensing elements. This may result in reduced reliability of signal validation associated with achieving the desired redundancy. As further noted, the reliability of the signal validation may further suffer in a case where the set of primary sensing elements is not substantially centered on the axis of rotation (e.g., where an excentricity exists such that the axis of rotation is shifted to the right of primary sensing element 2 of FIG. 1A).

FIG. 1B shows an example arrangement of an integrated angle sensor associated with achieving improved auxiliary angle sensor accuracy for the angle measurement of the magnetic field produced by the magnet that rotates about the axis (e.g., as compared to the arrangement shown in FIG. 1A).

As shown in the FIG. 1B, the integrated angle sensor may include the set of primary sensing elements and the set of auxiliary sensing elements. As shown, and similar to FIG. 1A, the set of primary sensing elements may be positioned such that the set of primary sensing elements is substantially centered on the axis of rotation of the magnet.

As further shown, the set of auxiliary sensing elements may be spatially separated within the integrated angle sensor. For example, as shown, a first auxiliary sensing element (e.g., auxiliary sensing element 1) may be positioned on a first side of the set of primary sensing elements (e.g., adjacent to primary sensing element 1 on a left side, as shown in FIG. 1B). As further shown, a second auxiliary sensing element (e.g., auxiliary sensing element 2) may be positioned on a second (opposite) side of the set of primary sensing elements from the first auxiliary sensing element (e.g., adjacent to primary sensing element 2 on a right side, as shown in FIG. 1B).

Notably, a distance from the first auxiliary sensing element to the axis of rotation may be approximately equal to a distance from the second auxiliary sensing element to the axis of rotation. As such, the set of auxiliary sensing elements may be substantially centered on the axis of rotation of the magnet in the same manner as the set of primary sensing elements. In some implementations, this arrangement of the primary sensing elements and the auxiliary sensing elements may be described as a centric arrangement. In such a case, the set of auxiliary sensing elements may be exposed to magnetic field conditions that are closer to magnetic field conditions to which the set primary sensing elements is exposed, as compared to the shifted arrangement.

As a result of this centric arrangement, and as noted in FIG. 1B, accuracy of an angle measurement calculated based on signals provided by the set of auxiliary sensing elements may be improved (e.g., as compared to the accuracy of the angle measurement calculated based on signals provided by the set of auxiliary sensing elements in the shifted arrangement) such that the angle error over the measurement range is substantially identical to the angle error of the primary sensing elements over the measurement range. This may result in an increased reliability of signal validation associated with achieving the desired redundancy. As further noted in FIG. 1B, in the case where the sets of sensing elements are not substantially centered on the axis of rotation, the reliability of the signal validation may be improved as compared to the shifted arrangement of FIG. 1A.

Figure 2:
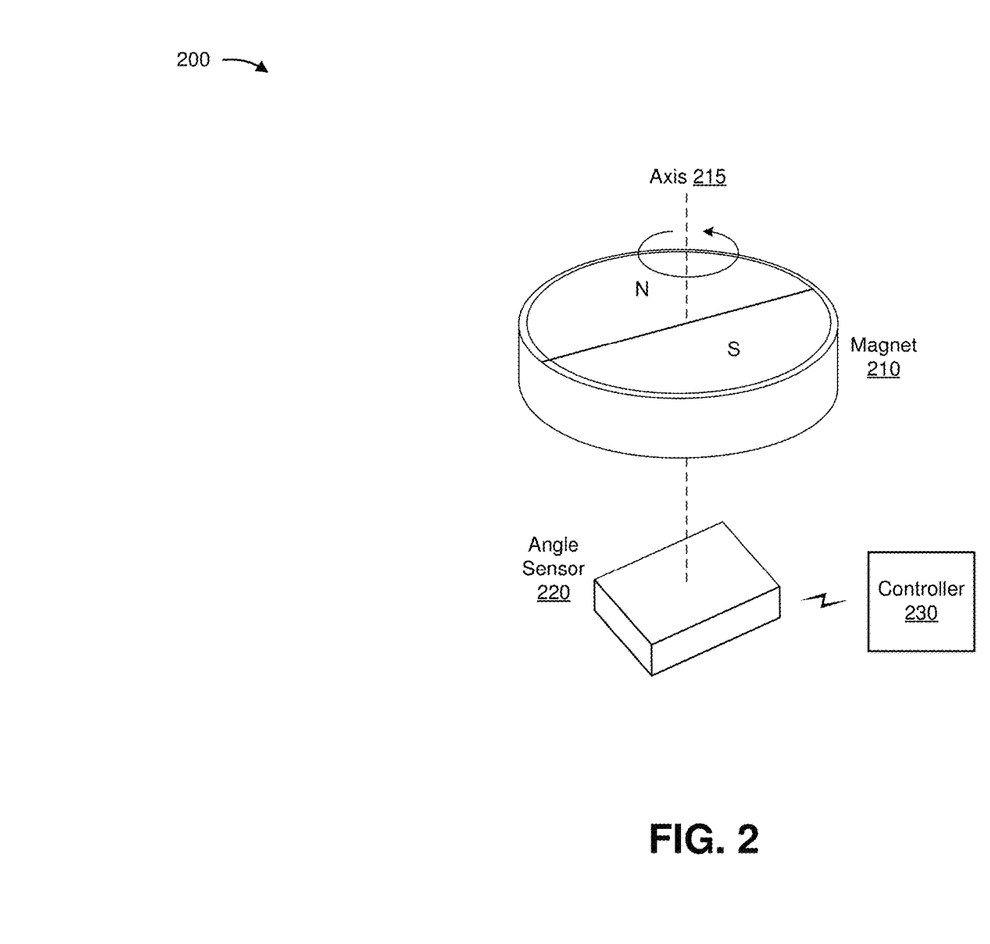
FIG. 2 is a diagram of an example environment in which apparatuses described herein may be implemented.

FIG. 2 is a diagram of an example environment 200 in which apparatuses described herein may be implemented. As shown in FIG. 2, environment 200 may include a magnet 210 that may rotate about an axis 215, an angle sensor 220, and a controller 230.

Magnet 210 may include one or more magnets positioned to rotate about axis 215 (e.g., an imaginary line). In some implementations, magnet 210 may be connected (e.g., mechanically) to a rotatable object (not shown) such that a rotation angle of magnet 210 corresponds to a rotation angle of the rotatable object (e.g., when there exists a non-slip relation between an end face of the rotatable object and magnet 210).

In the example environment 200 shown in FIG. 2, magnet 210 comprises a first half forming a north pole (N) and a second half forming a south pole (S), so that magnet 210 comprises one pole pair. In some implementations, magnet 210 may, without limitation, comprise more than one pole pair. In some implementations, magnet 210 may include a disk magnet that is positioned concentrically about axis 215 that passes through the center of magnet 210, as shown in FIG. 2. While magnet 210 is shown as circular in FIG. 2, magnet 210 may be another shape, such as a square, a rectangular, an ellipse, or the like. For example, magnet 210 may be of an elliptical shape in an instance where an angle between a plane corresponding to a surface of magnet 210 and axis 215 deviates from a substantially perpendicular relation. The plane may include a plane symmetrically cutting through magnet 210 and including a magnet center of magnet 210. In most practical cases, the plane may be substantially perpendicular to axis 215. As another example, magnet 210 may include a ring magnet that is positioned to rotate about axis 215 (along with the rotatable object). A ring magnet may be of interest for an arrangement of magnet 210 at an end of the rotatable object.

In some implementations, magnet 210 may include two alternating poles on two portions of magnet 210 (e.g., a north pole on a first half of magnet 210, a south pole on a second half of magnet 210). Additionally, or alternatively, magnet 210 may include a dipole magnet (e.g., a dipole bar magnet, a circular dipole magnet, an elliptical dipole magnet, etc.), a permanent magnet, an electromagnet, a magnetic tape, or the like. Magnet 210 may be comprised of a ferromagnetic material (e.g., Hard Ferrite), and may produce a magnetic field. Magnet 210 may further comprise a rare earth magnet which may be of advantage due to an intrinsically high magnetic field strength of rare earth magnets. As described above, in some implementations, magnet 210 may be attached to or coupled with a rotatable object for which a rotation angle may be determined (e.g., by angle sensor 220, by controller 230) based on a rotation angle of magnet 210.

Angle sensor 220 may include one or more apparatuses for detecting components of a magnetic field for use in determining an angle of rotation (e.g., of magnet 210, of a rotatable object to which magnet 210 is connected, etc.). For example, angle sensor 220 may include one or more circuits (e.g., one or more integrated circuits). In some implementations, angle sensor 220 may be placed at a position relative to magnet 210 such that angle sensor 220 may detect components of the magnetic field produced by magnet 210. In some implementations, angle sensor 220 may include an integrated circuit that includes an integrated controller 230 (e.g., such that an output of angle sensor 220 may include information that describes a rotation angle of magnet 210 and/or the rotatable object).

In some implementations, angle sensor 220 may include a group of sensing elements configured to sense amplitudes of components of the magnetic field, produced by magnet 210, that are present at angle sensor 220. For example, angle sensor 220 may include a set of primary sensing elements and a pair of auxiliary sensing elements. Additional details regarding angle sensor 220 are described below with regard to FIG. 3.

Controller 230 may include one or more circuits associated with determining a rotation angle of magnet 210, and providing information associated with the rotation angle of magnet 210 and hence the rotation angle of the rotatable object to which magnet 210 is connected. For example, controller 230 may include one or more circuits (e.g., an integrated circuit, a control circuit, a feedback circuit, etc.). Controller 230 may receive input signals from one or more sensors, such as one or more angle sensors 220, may process the input signals (e.g., using an analog signal processor, a digital signal processor, etc.) to generate an output signal, and may provide the output signal to one or more other devices or systems. For example, controller 230 may receive one or more input signals from angle sensor 220, and may use the one or more input signals to generate an output signal comprising the angular position of magnet 210 and/or the rotatable object to which magnet 210 is connected.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
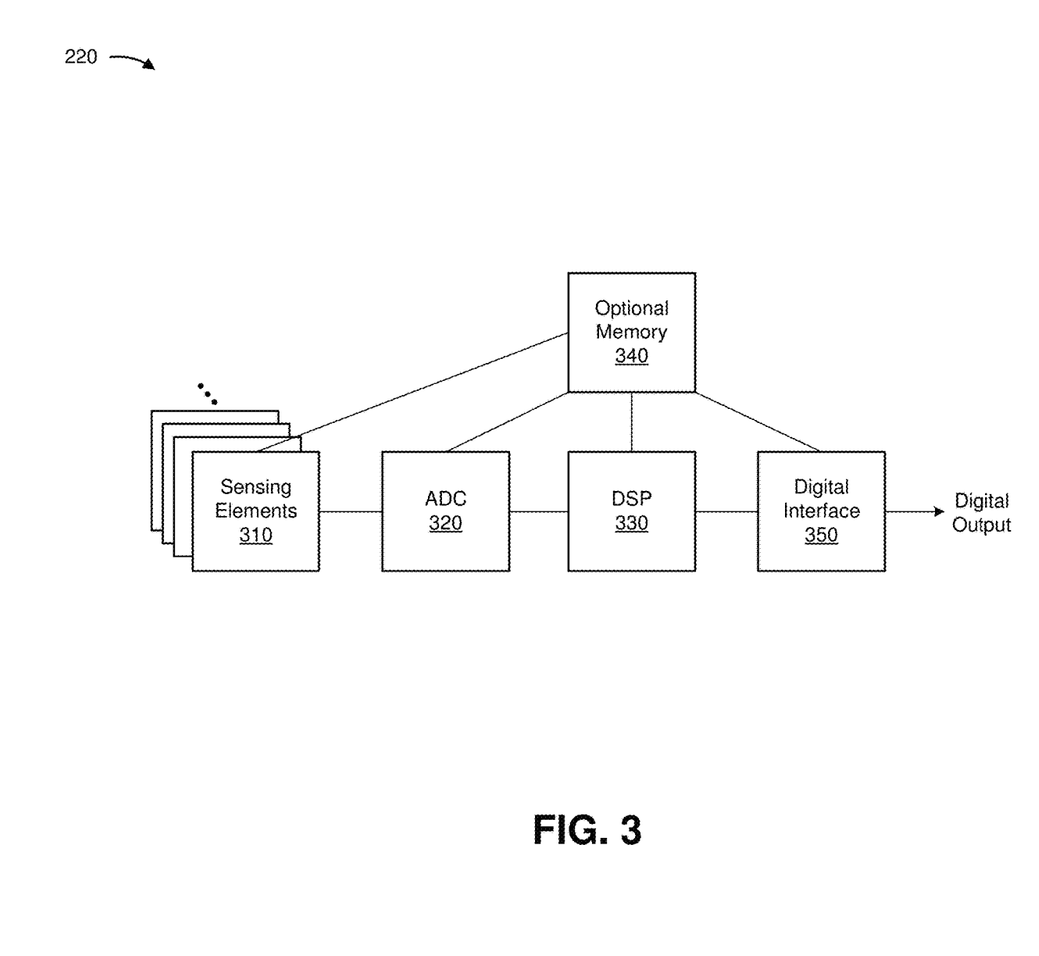
FIG. 3 is a diagram of example components of an angle sensor included in the example environment of FIG. 2.

FIG. 3 is a diagram of example components of angle sensor 220 included in example environment 200 of FIG. 2. As shown, angle sensor 220 may include a group of sensing elements 310, an analog-to-digital convertor (ADC) 320, a digital signal processor (DSP) 330, an optional memory component 340, and a digital interface 350.

Sensing element 310 may include one or more apparatuses for sensing an amplitude of a component of a magnetic field present at angle sensor 220 (e.g., the magnetic field generated by magnet 210). For example, sensing element 310 may include a Hall sensor that operates based on a Hall-effect. As another example, sensing element 310 may include a MR sensor, comprised of a magnetoresistive material (e.g., nickel iron (NiFe)), where the electrical resistance of the magnetoresistive material may depend on a strength and/or a direction of the magnetic field present at the magnetoresistive material. Here, sensing element 310 may measure magnetoresistance based on an anisotropic magnetoresistance (AMR) effect, a giant magnetoresistance (GMR) effect, a tunnel magnetoresistance (TMR) effect, or the like. As an additional example, sensing element 310 may include a variable reluctance (VR) sensor that operates based on induction.

In some implementations, sensing element 310 may include a full bridge (e.g., a Wheatstone bridge). As such, in some implementations, the group of sensing elements 310 may include a group of full bridges. Each full bridge may be configured to output signals (e.g., sine signals, cosine signals, etc.) corresponding to the amplitude of the component of the magnetic field present at the position of the respective full bridge. In some implementations, the output signals may be used (e.g., by angle sensor 220 and/or controller 230) to determine a rotation angle of magnet 210 and, hence, a rotation angle of a rotatable object to which magnet 210 is connected.

In some implementations, the group of sensing elements 310 of angle sensor 220 may include sensing elements associated with achieving redundancy for the angle as sensed by angle sensor 220. For example, the group of sensing elements 310 may include a set of primary sensing elements and a set of auxiliary sensing elements. The set of primary sensing elements may include a set of sensing elements 310 positioned to sense the components of the magnetic field such that angle sensor 220 and/or controller 230 may determine a primary measurement of the angle of rotation of magnet 210. The set of auxiliary sensing elements may include a set of sensing elements 310 positioned to sense the components of the magnetic field such that angle sensor 220 and/or controller 230 may determine an auxiliary (e.g., redundant, backup, etc.) measurement of the angle of rotation of magnet 210.

As one example, the group of sensing elements 310 may include a first primary sensing element (e.g., a first full bridge), a second primary sensing element (e.g., a second full bridge), a first auxiliary sensing element (e.g., a third full bridge), and a second auxiliary sensing element (e.g., a fourth full bridge). The first primary sensing element may be configured to provide sine signals corresponding to the sine component of the magnetic field at the position of the first primary sensing element. The second primary sensing element may be configured to provide cosine signals corresponding to the cosine component of the magnetic field at the position of the second primary sensing element. The first auxiliary sensing element may be configured to provide signals corresponding to the sine component of the magnetic field at the position of the first auxiliary sensing element, and the second auxiliary sensing element may be configured to provide signals corresponding cosine component of the magnetic field at the position of the second auxiliary sensing element.

In some implementations, the group of sensing elements 310 may be arranged in a centric layout with respect to axis 215 about which magnet 210 rotates in order to improve angle accuracy and/or reliability of signal validation associated with angle sensor 220. Additional details regarding the arrangement of the group of sensing elements 310 are described below with regard to FIG. 4.

ADC 320 may include an analog-to-digital converter that converts an analog signal from the one or more sensing elements 310 to a digital signal. For example, ADC 320 may convert analog signals, received from the one or more sensing elements 310, into digital signals to be processed by DSP 330. ADC 320 may provide the digital signals to DSP 330. In some implementations, angle sensor 220 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for controller 230 as shown in FIG. 2), such as output signals associated with determining the rotation angle of magnet 210 rotating with a rotatable object.

Optional memory component 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by angle sensor 220. In some implementations, optional memory component 340 may store information associated with processing performed by DSP 330. Additionally, or alternatively, optional memory component 340 may store configurational values or parameters for sensing elements 310 and/or information for one or more other components of angle sensor 220, such as ADC 320 or digital interface 350.

Digital interface 350 may include an interface via which angle sensor 220 may receive and/or provide information from and/or to another device, such as controller 230 (see FIG. 2). For example, digital interface 350 may provide the output signal, determined by DSP 330, to controller 230 and may further receive information from the controller 230.

The number and arrangement of components shown in FIG. 3 are provided as an example. In practice, angle sensor 220 may include additional components, fewer components, different components, or differently arranged components than those shown in FIG. 3. Additionally, or alternatively, a set of components (e.g., one or more components) of angle sensor 220 may perform one or more functions described as being performed by another set of components of angle sensor 220.

Figure 4:
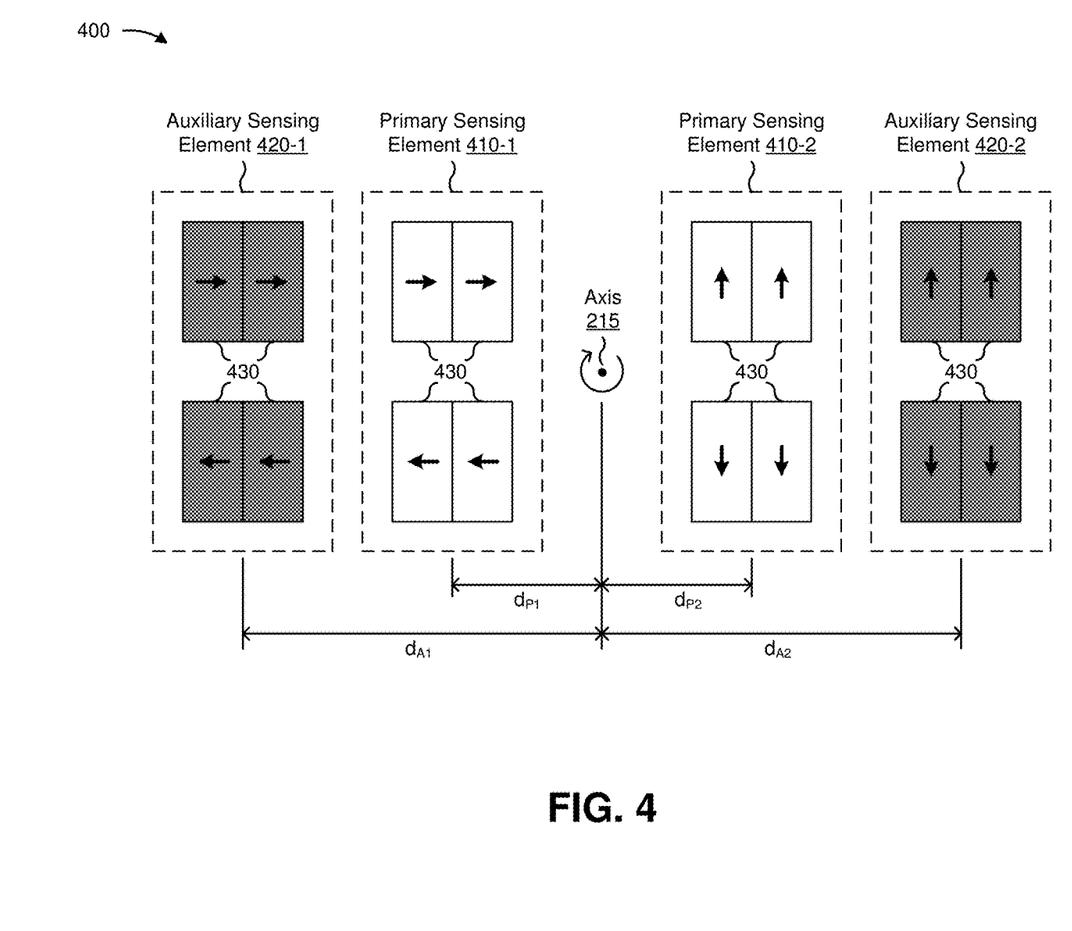
FIG. 4 is a diagram of an example centric arrangement of sensing elements included in the angle sensor of FIG. 3.

FIG. 4 is a diagram of an example centric arrangement 400 of sensing elements 310 included in angle sensor 220. As shown in FIG. 4, the group of sensing elements 310 may include a set of primary sensing elements (e.g., a first pair of Wheatstone bridges), identified as primary sensing element 410-1 and primary sensing element 410-2, and a set of auxiliary sensing elements (e.g., a second pair of Wheatstone bridges) identified as auxiliary sensing element 420-1 and auxiliary sensing element 420-2. As described above, in order to achieve redundancy, the set of primary sensing elements may be configured to provide signals associated with determining a primary measurement of an angle of rotation of magnet 210, and the set of auxiliary sensing elements may be configured to provide signals associated with determining an auxiliary measurement of the angle of rotation of magnet 210.

As shown, each of the set of primary sensing elements and the set of auxiliary sensing elements may include a group of four resistors 430. FIG. 4 shows an example arrangement for an implementation in which spin-valve structures, based on GMR or TMR technology, are used. The spin-valve-structures may exhibit a sensor (free) layer, where a magnetization of the sensor layer is influenced by the external magnetic field, and a reference layer having a fixed magnetization direction. Here, directions of arrows within resistors 430 may indicate an orientation of the magnetization of the reference layer associated with each respective resistor 430. For an implementation in which AMR based technology is used, different directions of arrows within resistors 430 may indicate different current directions. In the AMR implementation, the arrows may be directed 90 degrees apart in a particular sensing element 310 (e.g., rather than 180 degrees), and may also be rotated 45 degrees. Independent of the technology used, positions of pairs of resistors 430 may vary (e.g., a pair of resistors 430 being defined based on reference directions). In other words, in some implementations, positions of resistors 430 and/or pairs of resistors 430 included in one or more sensing elements 310 may be interchanged.

As further shown in FIG. 4, the set of primary sensing elements and the set of auxiliary sensing elements may be positioned in a centric arrangement with respect to axis 215.

As shown, primary sensing element 410-1 may be positioned at a first distance from axis 215, identified as $d_{P1}$. As further shown, primary sensing element 410-2 may be positioned at a second distance from axis 215, identified as $d_{P2}$. In some implementations, $d_{P1}$ may be approximately equal to $d_{P2}$. As further shown, primary sensing element 410-1 and primary sensing element 410-2 may also be positioned such that primary sensing element 410-1 and primary sensing element 410-2 lie on an plane that is substantially perpendicular to axis 215 (e.g., an axis corresponding to a surface of magnet 210). In other words, the set of primary sensing elements may be substantially centered on axis 215.

As further shown, the set of auxiliary sensing elements may be spatially separated such that the set of primary sensing elements is positioned between the set of auxiliary sensing elements. For example, as shown, auxiliary sensing element 420-1 may be positioned at a third distance from axis 215, identified as $d_{A1}$. As also shown, auxiliary sensing element 420-2 may be positioned at a fourth distance from axis 215, identified as $d_{A2}$. In some implementations, $d_{A1}$ may be approximately equal to $d_{A2}$. As further shown, in some implementations, auxiliary sensing element 420-1 and auxiliary sensing element 420-2 may also be positioned along the axis that is substantially perpendicular to axis 215. For example, auxiliary sensing element 420-1 may be positioned adjacent to primary sensing element 410-1 (e.g., on a left side in a direction away from axis 215), while auxiliary sensing element 420-2 may be positioned adjacent to primary sensing element 410-2 (e.g., on a right side in a direction away from axis 215). In other words, the set of auxiliary sensing elements may also be substantially centered on axis 215, while being spatially separated such that the set of primary sensing elements is lies between the set of auxiliary sensing elements.

In this way, the centric arrangement of sensing elements 310 may be achieved. However, as indicated above, FIG. 4 is provided merely as an example. In other words, all arrangements, positions, orientations, or the like, associated with example centric arrangement 400 are provided merely as examples to facilitate an understanding of how sensing elements 310 may be arranged. Other examples are possible and may differ from what was described with regard to FIG. 4.

Figure 5A:
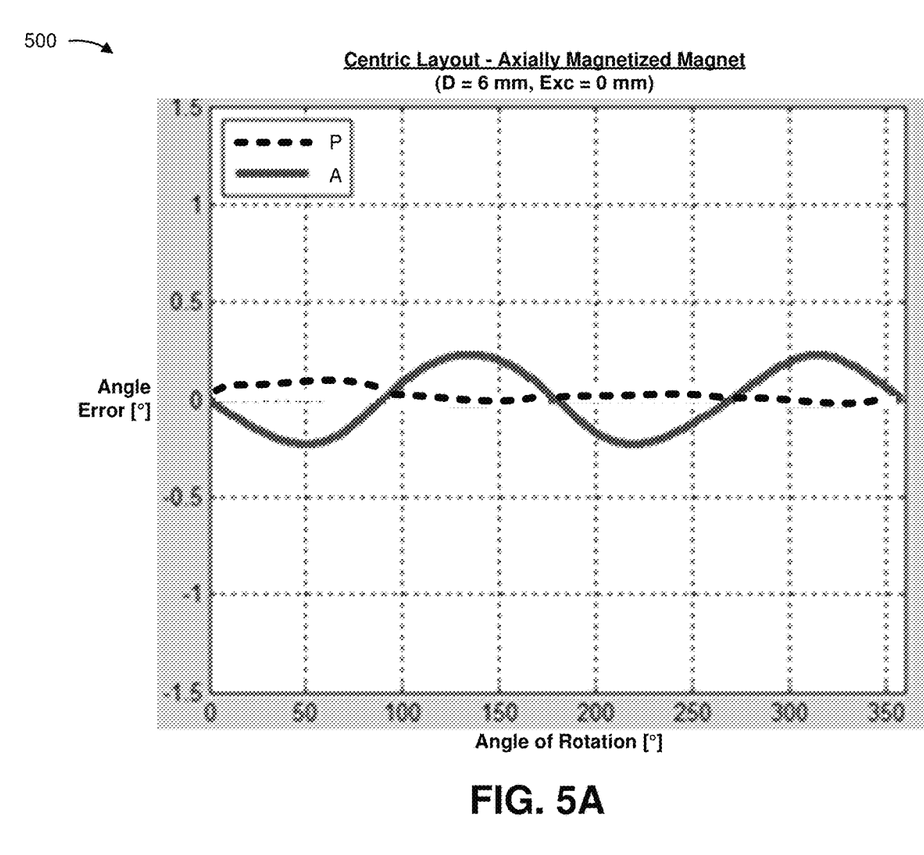
FIGS. 5A and 5B are graphical representations showing comparisons of example angle accuracies between a centric arrangement of sensing elements within an angle sensor and a shifted arrangement of sensing elements within the angle sensor, with zero excentricity with respect to an axis of rotation.
Figure 5B:
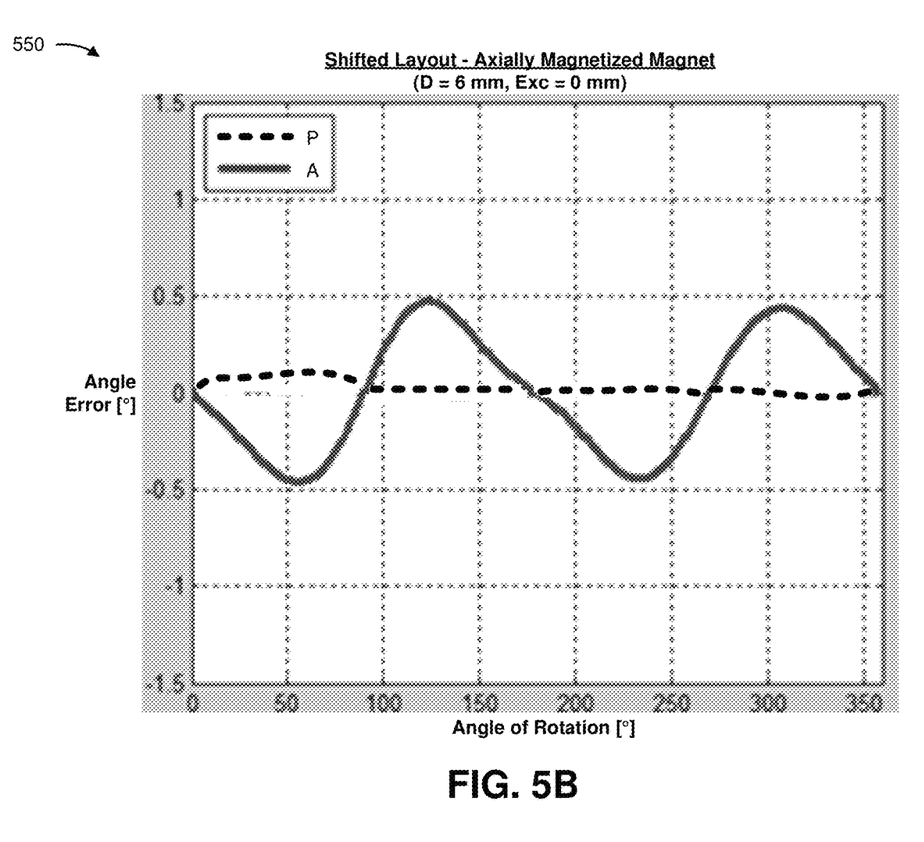

FIGS. 5A and 5B are graphical representations 500 and 550, respectively, showing comparisons of example angle accuracies between a centric arrangement of sensing elements 310 within angle sensor 220 and a shifted arrangement of sensing elements 310 within angle sensor 220. For the purposes of FIGS. 5A and 5B, magnet 210 is a disk magnet with a thickness of 3.0 millimeters (mm) and a diameter 6.0 mm, and is configured to rotate about axis 215. Further, angle sensor 220 is positioned to sense a magnetic field, produced by magnet 210, for purposes of determining an angle of rotation of magnet 210.

For the purposes of FIG. 5A, assume that angle sensor 220 includes a set of primary sensing elements and a set of auxiliary sensing elements that are positioned in a centric arrangement, as described above with regard to FIG. 1B and FIG. 4. Further, assume that the primary sensing elements are positioned such that the set of primary sensing elements and the set of auxiliary sensing elements are centered on axis 215 (i.e., that no excentricity exists, as noted in the upper portion of FIG. 5A). As shown by the dotted line (e.g., labeled as line "P" in FIG. 5A), an angle error experienced by the set of primary sensing elements may vary between approximately 0.10 degrees and approximately −0.05 degrees for any angle (e.g., from 0 degrees to 360 degrees) of rotation of magnet 210. As shown by the solid line (e.g., labeled as line "A" in FIG. 5A), an angle error experienced by the set of auxiliary sensing elements may vary between approximately 0.25 degrees and approximately −0.25 degrees for any angle of rotation of magnet 210.

For the purposes of FIG. 5B, assume that angle sensor 220 includes a set of primary sensing elements and a set of auxiliary element elements that are positioned in a shifted arrangement, as illustrated in FIG. 1A. Further, assume that the primary sensing elements are positioned such that the set of primary sensing elements and the set of auxiliary sensing elements are centered on axis 215 (i.e., that no excentricity exists, as noted in the upper portion of FIG. 5B). As shown by the dotted line (e.g., labeled as line "P" in FIG. 5B), an angle error experienced by the set of primary sensing elements may vary between approximately 0.10 degrees and approximately −0.05 degrees for any angle of rotation of magnet 210 (i.e., the behavior of the set of primary sensing elements may be the same as FIG. 5A). However, as shown by the solid line (e.g., labeled as line "A" in FIG. 5B), an angle error experienced by the set of auxiliary sensing elements may vary between approximately 0.50 degrees and approximately −0.50 degrees for any angle of rotation of magnet 210.

As illustrated by comparing FIGS. 5A and 5B, an angle error (i.e., a reduction in angle accuracy) experienced by the set of auxiliary sensing elements positioned in the shifted arrangement may be at least approximately two times greater than an angle error experienced by the set of auxiliary sensing elements positioned in the centric arrangement. As described above, this reduction in angle accuracy may cause reduced reliability of signal validation, thereby negatively impacting achievement of redundancy for angle sensor 220.

As indicated above, FIGS. 5A and 5B are provided merely as examples. Other examples are possible and may differ from what was described with regard to FIGS. 5A and 5B.

Figure 6A:
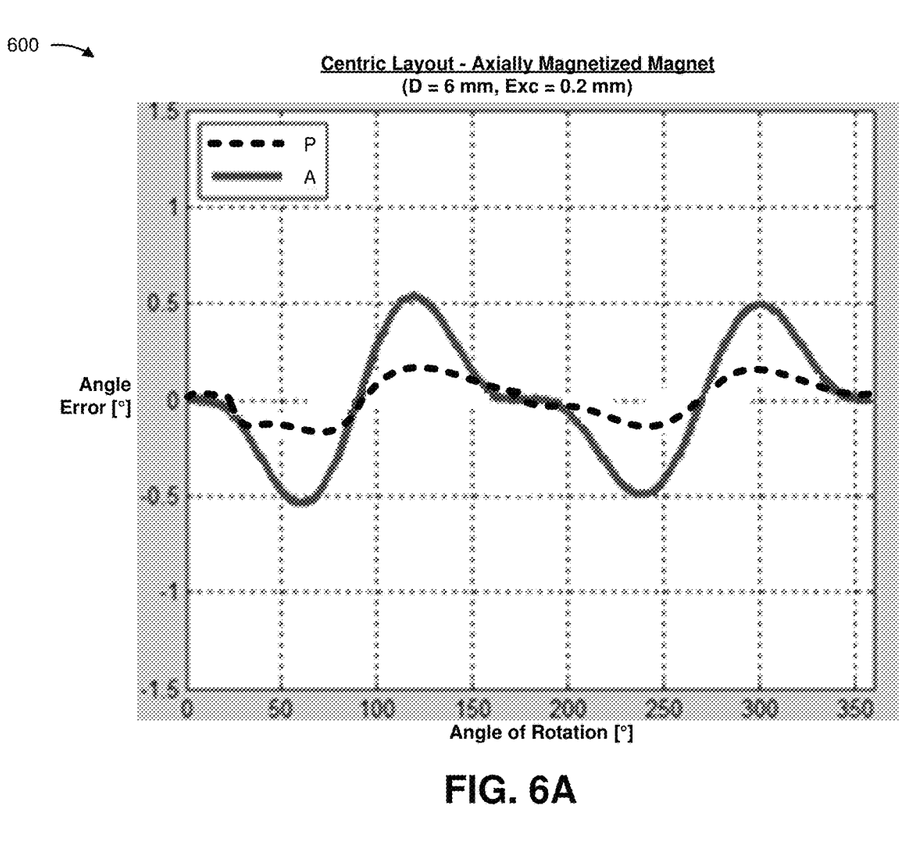
FIGS. 6A and 6B are graphical representations showing additional example comparisons of example angle accuracies between a centric arrangement of sensing elements within an angle sensor and a shifted arrangement of sensing elements within the angle sensor, with an excentricity with respect to an axis of rotation.
Figure 6B:
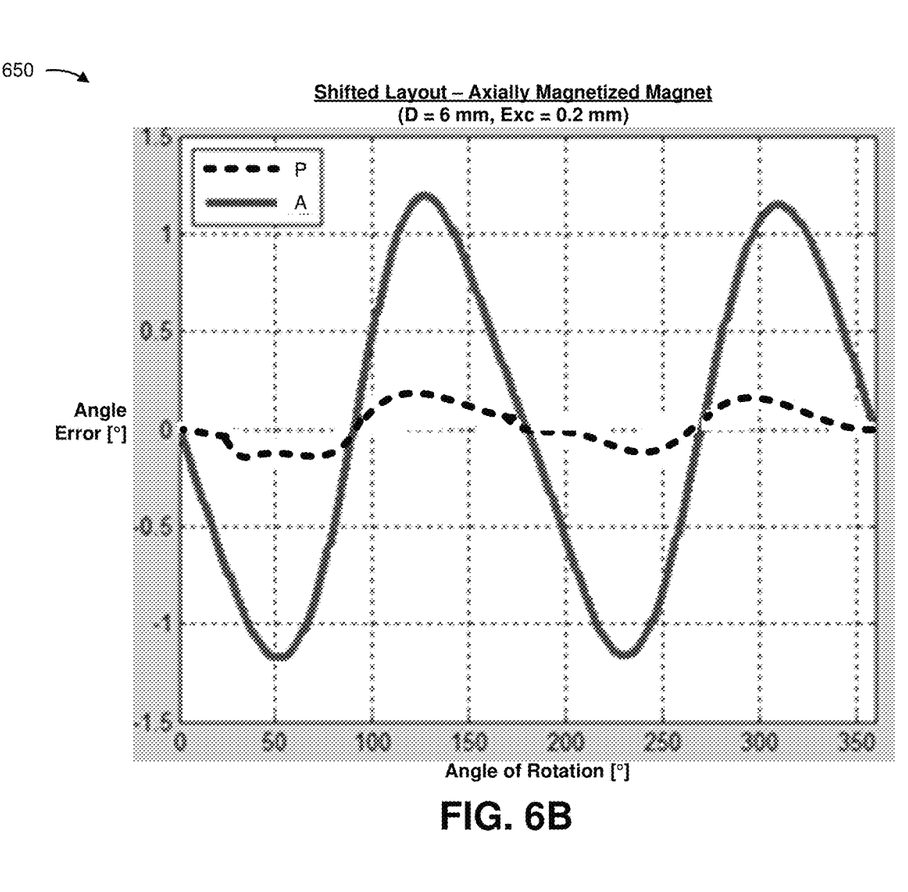

FIGS. 6A and 6B are graphical representations 600 and 650, respectively, showing additional example comparisons of example angle accuracies between a centric arrangement of sensing elements 310 within angle sensor 220 and a shifted arrangement of sensing elements 310 within angle sensor 220. For the purposes of FIGS. 6A and 6B, magnet 210 is a disk magnet with a thickness of 3.0 millimeters (mm) and a diameter 6.0 mm, and is configured to rotate about axis 215. Further, angle sensor 220 is positioned to sense a magnetic field, produced by magnet 210, for purposes of determining an angle of rotation of magnet 210.

For the purposes of FIG. 6A, assume that angle sensor 220 includes a set of primary sensing elements and a set of auxiliary sensing elements that are positioned in a centric arrangement, as described above with regard to FIG. 1B and FIG. 4. Further, assume that the primary sensing elements are positioned such that the set of primary sensing elements and the set of auxiliary sensing elements are not centered on axis 215 (i.e., that 0.2 mm of excentricity exists, as noted in the upper portion of FIG. 6A). As shown by the dotted line (e.g., labeled as line "P" in FIG. 6A), an angle error experienced by the set of primary sensing elements may vary between approximately 0.20 degrees and approximately −0.10 degrees for any angle (e.g., from 0 degrees to 360 degrees) of rotation of magnet 210. As shown by the solid line (e.g., labeled as line "A" in FIG. 6A), an angle error experienced by the set of auxiliary sensing elements may vary between approximately 0.55 degrees and approximately −0.55 degrees for any angle of rotation of magnet 210.

For the purposes of FIG. 6B, assume that angle sensor 220 includes a set of primary sensing elements and a set of auxiliary sensing elements that are positioned in a shifted arrangement, as illustrated in FIG. 1A. Further, assume that the primary sensing elements are positioned such that the set of primary sensing elements are not centered on axis 215 (i.e., that 0.2 mm of excentricity exists, as noted in the upper portion of FIG. 6B). As shown by the dotted line (e.g., labeled as line "P" in FIG. 6B), an angle error experienced by the set of primary sensing elements may vary between approximately 0.20 degrees and approximately −0.10 degrees for any angle of rotation of magnet 210 (i.e., the behavior of the set of primary sensing elements may be the same as FIG. 6A). However, as shown by the solid line (e.g., labeled as line "A" in FIG. 6B), an angle error experienced by the set of auxiliary sensing elements may vary between approximately 1.10 degrees and approximately −1.10 degrees for any angle of rotation of magnet 210.

As illustrated by comparing FIGS. 6A and 6B, an angle error (i.e., a reduction in angle accuracy) experienced by the set of auxiliary sensing elements positioned in the shifted arrangement may be at least approximately two times greater than an angle error experienced by the set of auxiliary sensing elements positioned in the centric arrangement. As described above, this reduction in angle accuracy may cause reduced reliability of signal validation, thereby negatively impacting achievement of redundancy for angle sensor 220. Further, as illustrated by comparing FIGS. 6A and 6B, positioning the primary sensing element and the auxiliary sensing elements in the centric arrangement may reduce an effect on angle accuracy when the set of primary sensing elements and/or the set of auxiliary sensing elements are excentrically positioned with respect to axis 215.

As indicated above, FIGS. 6A and 6B are provided merely as examples. Other examples are possible and may differ from what was described with regard to FIGS. 6A and 6B.

Implementations described herein may provide an angle sensor that integrates (e.g., on a single substrate) a primary angle sensor and an auxiliary angle sensor. Within the integrated angle sensor, a set of auxiliary sensing elements may be spatially separated such that a set of primary sensing elements is positioned between the set of auxiliary sensing elements. Such an arrangement may allow for improved angle accuracy, associated with an angle as sensed by the set of auxiliary sensing elements, and/or may allow for a reduced effect on angle accuracy when the set of primary sensing elements are excentrically positioned with respect to an axis of rotation of the magnet. As such, redundancy of the integrated angle sensor may be improved (e.g., as compared to spatially separating the primary angle sensor and the auxiliary angle sensor) such that a functional safety goal may be achieved.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An angle sensor, comprising:
    a set of primary sensing elements that provide signals associated with determining a primary angle measurement of a magnetic field produced by a magnet,
        the set of primary sensing elements including a first primary sensing element and a second primary sensing element,
        the first primary sensing element being positioned adjacent to the second primary sensing element in a plane substantially parallel with respect to a face of the magnet, and
        an axis of rotation of the magnet intersecting the plane substantially parallel with respect to the face of the magnet between the first primary sensing element and the second primary sensing element; and
    a set of backup sensing elements that provide signals associated with determining a backup angle measurement of the magnetic field,
        the set of backup sensing elements including a first backup sensing element and a second backup sensing element,
        the first backup sensing element having a first same bridge configuration as the first primary sensing element,
        the second backup sensing element having a second same bridge configuration as the second primary sensing element,
            the first same bridge configuration being different than the second same bridge configuration, and
        the first primary sensing element and the second primary sensing element being positioned between the first backup sensing element and the second backup sensing element in the plane substantially parallel with respect to the face of the magnet.

2. The angle sensor of claim 1, where a distance between the first backup sensing element and the first primary sensing element is substantially equal to a distance between the second backup sensing element and the second primary sensing element.

3. The angle sensor of claim 1, where the first primary sensing element and the second primary sensing element are substantially equal in distance with respect to the axis of rotation of the magnet,
 the axis of rotation being substantially perpendicular to the face of the magnet.

4. The angle sensor of claim 1, where the first backup sensing element and the second backup sensing element are substantially equal in distance with respect to the axis of rotation of the magnet,
 the axis of rotation being substantially perpendicular to the face of the magnet.

5. The angle sensor of claim 1, where the first primary sensing element includes a first Wheatstone bridge, the second primary sensing element includes a second Wheatstone bridge, the first backup sensing element includes a third Wheatstone bridge, and the second backup sensing element includes a fourth Wheatstone bridge.

6. The angle sensor of claim 1, where the first primary sensing element, the second primary sensing element, the first backup sensing element, and the second backup sensing element sense the magnetic field, produced by the magnet, based on a Hall-effect, a tunnel magnetoresistance (TMR) effect, a giant magnetoresistance (GMR) effect, or an anisotropic magnetoresistance (AMR) effect.

7. The angle sensor of claim 1, where the first primary sensing element and the second primary sensing element are excentrically positioned with respect to the axis of rotation of the magnet,
 the axis of rotation being substantially perpendicular to the face of the magnet.

8. A magnetic sensor, comprising:
 a set of primary sensing elements that provide signals associated with determining a primary angle measurement of a magnetic field produced by a magnet,
  the set of primary sensing elements including a first primary sensing element and a second primary sensing element,
  the first primary sensing element being positioned adjacent to the second primary sensing element in a plane substantially parallel to a face of the magnet,
  an axis of rotation of the magnet intersecting the plane substantially parallel with respect to the face of the magnet between the first primary sensing element and the second primary sensing element, and
  the first primary sensing element and the second primary sensing element being substantially equal in distance from the axis of rotation of the magnet; and
 a set of backup sensing elements that provide signals associated with determining an backup angle measurement of the magnetic field,
  the set of backup sensing elements including a first backup sensing element and a second backup sensing element,
  the first backup sensing element having a first same bridge configuration as the first primary sensing element,
  the second backup sensing element having a second same bridge configuration as the second primary sensing element,
   the first same bridge configuration being different than the second same bridge configuration, and
  the first primary sensing element and the second primary sensing element being positioned between the first backup sensing element and the second backup sensing element in the plane substantially parallel to the face of the magnet,
  the first backup sensing element and the second backup sensing element being substantially equal in distance from the axis of rotation of the magnet.

9. The magnetic sensor of claim 8, where a distance between the first backup sensing element and the first primary sensing element is substantially equal to a distance between the second backup sensing element and the second primary sensing element.

10. The magnetic sensor of claim 8, where the first primary sensing element and the second primary sensing element are substantially centered on the axis of rotation of the magnet,
 the axis of rotation being substantially perpendicular to the face of the magnet.

11. The magnetic sensor of claim 8, where the first backup sensing element and the second backup sensing element are substantially centered on the axis of rotation of the magnet,
 the axis of rotation being substantially perpendicular to the face of the magnet.

12. The magnetic sensor of claim 8, where the first primary sensing element includes a first full bridge, the second primary sensing element includes a second full bridge, the first backup sensing element includes a third full bridge, and the second backup sensing element includes a fourth full bridge.

13. The magnetic sensor of claim 8, where the first primary sensing element, the second primary sensing element, the first backup sensing element, and the second backup sensing element sense the magnetic field, produced by the magnet, based on a Hall-effect, a tunnel magnetoresistance (TMR) effect, a giant magnetoresistance (GMR) effect, or an anisotropic magnetoresistance (AMR) effect.

14. A magnetic angle sensor, comprising:
 a set of primary sensing elements that provide signals associated with determining a primary angle measurement of a magnetic field produced by a magnet,
  the set of primary sensing elements including:
   a first primary sensing element, and
   a second primary sensing element; and
 a set of backup sensing elements that provide signals associated with determining a backup angle measurement of the magnetic field,
  the set of backup sensing elements including:
   a first backup sensing element, and
   a second backup sensing element,
  the first primary sensing element being positioned adjacent to the second primary sensing element,
  the first backup sensing element being positioned adjacent to the first primary sensing element,
  the second backup sensing element being positioned adjacent to the second primary sensing element,
  the first primary sensing element and the second primary sensing element being positioned between the first backup sensing element and the second backup sensing element,
  the first primary sensing element and the second primary sensing element being in a plane substantially parallel with respect to a face of the magnet,
  an axis of rotation of the magnet intersecting the plane substantially parallel with respect to the face of the magnet between the first primary sensing element and the second primary sensing element,
  the first backup sensing element having a first same bridge configuration as the first primary sensing element, the second backup sensing element having a second same bridge configuration as the second primary sensing element, and the first same bridge configuration being different than the second same bridge configuration.

15. The magnetic angle sensor of claim 14, where a distance between the first backup sensing element and the first primary sensing element is substantially equal to a distance between the second backup sensing element and the second primary sensing element.

16. The magnetic angle sensor of claim 14, where the first primary sensing element and the second primary sensing element are substantially centered on the axis of rotation of the magnet, the axis of rotation being substantially perpendicular to the face of the magnet.

17. The magnetic angle sensor of claim 14, where the first backup sensing element and the second backup sensing element are substantially equal in distance with respect to the axis of rotation of the magnet.

18. The magnetic angle sensor of claim 14, where the first primary sensing element includes a first Wheatstone bridge, the second primary sensing element includes a second Wheatstone bridge, the first backup sensing element includes a third Wheatstone bridge, and the second backup sensing element includes a fourth Wheatstone bridge.

19. The magnetic angle sensor of claim 14, where the first primary sensing element, the second primary sensing element, the first backup sensing element, and the second backup sensing element sense the magnetic field, produced by the magnet, based on a Hall-effect, a tunnel magnetoresistance (TMR) effect, a giant magnetoresistance (GMR) effect, or an anisotropic magnetoresistance (AMR) effect.

20. The magnetic angle sensor of claim 14, where the first backup sensing element and the second backup sensing element are excentrically positioned with respect to the axis of rotation of the magnet, the axis of rotation being substantially perpendicular to the face of the magnet.

* * * * *